US012265321B2

(12) United States Patent
Kosaka et al.

(10) Patent No.: US 12,265,321 B2
(45) Date of Patent: Apr. 1, 2025

(54) REFLECTIVE MASK BLANK, AND METHOD FOR MANUFACTURING REFLECTIVE MASK

(71) Applicant: Shin-Etsu Chemical Co., Ltd., Tokyo (JP)

(72) Inventors: Takuro Kosaka, Joetsu (JP); Taiga Ogose, Joetsu (JP); Yukio Inazuki, Joetsu (JP); Hideo Kaneko, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 553 days.

(21) Appl. No.: 17/828,702

(22) Filed: May 31, 2022

(65) Prior Publication Data

US 2022/0404694 A1    Dec. 22, 2022

(30) Foreign Application Priority Data

Jun. 18, 2021   (JP) ................. 2021-101287

(51) Int. Cl.
*G03F 1/24* (2012.01)
(52) U.S. Cl.
CPC ..................... *G03F 1/24* (2013.01)
(58) Field of Classification Search
CPC ......................................... G03F 1/24
USPC .......................................... 430/5
See application file for complete search history.

(56) References Cited

U.S. PATENT DOCUMENTS

2003/0067598 A1   4/2003  Tomie
2020/0310244 A1  10/2020  Nakagawa et al.

FOREIGN PATENT DOCUMENTS

| JP | 2002-246299 A | 8/2002 |
| JP | 2003-114200 A | 4/2003 |
| JP | 2017-521712 A | 8/2017 |
| JP | 2020-160354 A | 10/2020 |
| WO | WO 2016/007396 A1 | 1/2016 |

OTHER PUBLICATIONS

The extended European search report issued in European Application 22179311.0, mailed on Nov. 29, 2022.

*Primary Examiner* — Christopher G Young
(74) *Attorney, Agent, or Firm* — Birch, Stewart, Kolasch & Birch, LLP

(57) ABSTRACT

With respect to a reflective mask blank for a reflective mask used in EUV lithography using EUV light, the reflective mask blank including a substrate, a multilayer reflection film having a periodically laminated structure in which low-refractive index layers composed of a material containing molybdenum and high-refractive index layers are alternately laminated, a protection film, and an absorber film is provided. The low-refractive index layer consists of one or more of first low-refractive index sublayers, and one or more of second low-refractive index sublayers that have a different composition from a composition of the first low-refractive index sublayer.

8 Claims, 1 Drawing Sheet

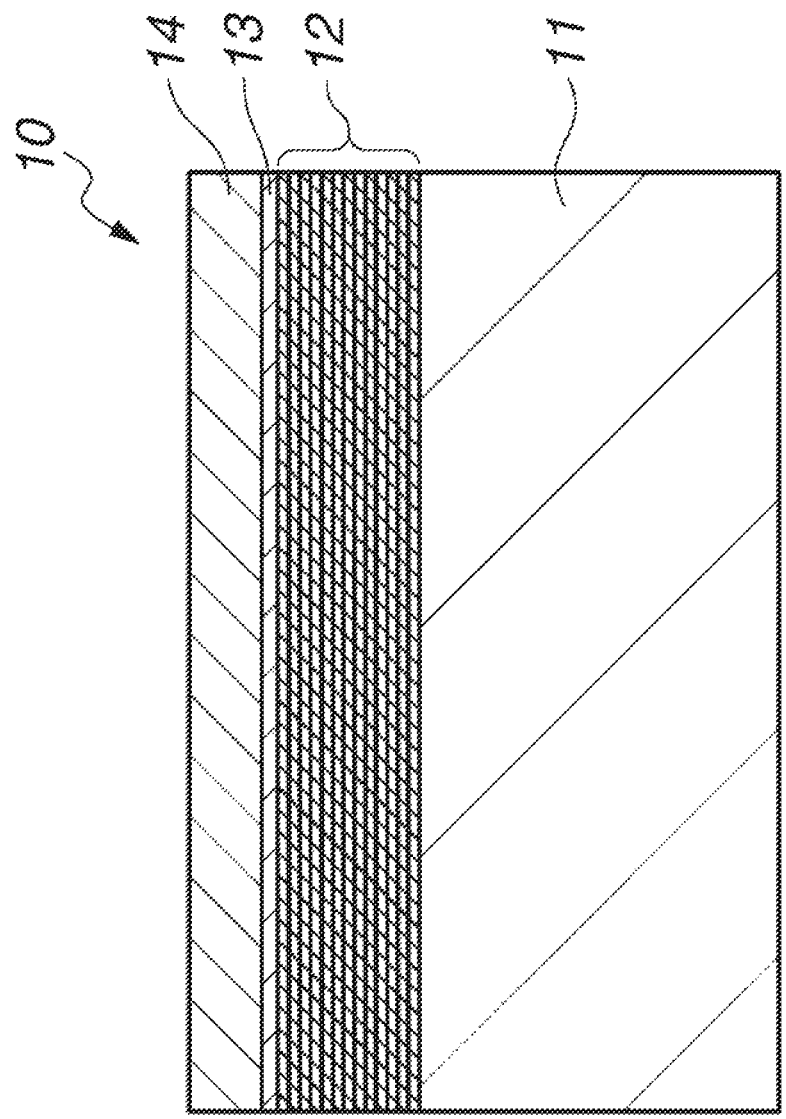

REFLECTIVE MASK BLANK, AND METHOD FOR MANUFACTURING REFLECTIVE MASK

CROSS-REFERENCE TO RELATED APPLICATION

This non-provisional application claims priority under 35 U.S.C. § 119(a) on Patent Application No. 2021-101287 filed in Japan on Jun. 18, 2021, the entire contents of which are hereby incorporated by reference.

TECHNICAL FIELD

The present invention relates to a reflective mask blank which is a material for a reflective mask used in manufacturing a semiconductor device such as an LSI, particularly, a reflective mask blank suitable for an EUV mask blank which is a material for an EUV mask, and relates to a method for manufacturing a reflective mask using a reflective mask.

BACKGROUND ART

In a manufacturing process of a semiconductor device, a photolithography technique in which a circuit pattern formed on a transfer mask is transferred onto a semiconductor substrate (semiconductor wafer) through a reduction projection optical system with irradiating exposure light to the transfer mask is repeatedly used. Conventionally, a mainstream wavelength of the exposure light is 193 nm by argon fluoride (ArF) excimer laser light. A pattern with dimensions smaller than exposure wavelength has finally been formed by adopting a process called multi-patterning in which exposure processes and processing processes are combined multiple times.

However, since it is necessary to form a further fine pattern under continuous miniaturization of device patterns, EUV lithography technique using, as exposure light, extreme ultraviolet (EUV) light having a short wavelength less than the wavelength of ArF excimer laser light has been developed. EUV light is light having a wavelength of, for example, about 10 to 20 nm, in particular, light having a wavelength of around 13.5 nm. This EUV light has a very low transparency to a substance and cannot be utilized for a conventional transmissive projection optical system or a mask, thus, a reflection type optical elemental device is applied. Therefore, a reflective mask is also proposed as a mask for the pattern transfer. The reflective mask has a multilayer reflection film that is formed on a substrate and reflects EUV light, and a patterned absorber film that is formed on the multilayer reflection film and absorbs EUV light. Meanwhile, a material (including also a material in which a resist layer is formed) before patterning the absorber film is called a reflective mask blank, and is used as a material for the reflective mask. Generally, a reflective mask blank and a reflective mask for reflecting EUV light are called an EUV mask blank and an EUV mask, respectively.

The EUV mask blank has a basic structure including a low-thermal expansion substrate, a multilayer reflection film that is formed thereon and reflects EUV light, and an absorber film that is formed thereon and absorbs EUV light. As the multilayer reflection film, a multilayer reflection film in which molybdenum (Mo) layers and silicon (Si) layers are alternately laminated to obtain a necessary reflectance for EUV light is usually used. Further, as a protection film for protecting the multilayer reflection film, a ruthenium (Ru) film is formed as the outermost layer of the multilayer reflection film. On the other hand, for the absorber film, a material containing tantalum (Ta) or the like, which has a relatively large extinction coefficient with respect to EUV light, is used (Patent Document 1: JP-A 2002-246299).

CITATION LIST

Patent Document 1: JP-A 2002-246299
Patent Document 2: JP-A 2003-114200

SUMMARY OF THE INVENTION

In process of manufacturing a reflective mask, after forming a pattern by etching process of an absorber film of a reflective mask blank, generally, the pattern is inspected and corrected a defect if the defect is detected. In the case of the reflective mask, a defect so-called a phase defect in which the reflectance has been lowered due to an irregular structure of the multilayer reflection film exists in some cases. However, after forming the pattern of the absorber film, it is very difficult to directly correct this phase defect. Under these circumstances, it is important to detect the phase defect at the stage of the reflective mask blank. For example, JP-A 2003-114200 (Patent Document 2) discloses, as a method for detecting defects inside a multilayer reflection film using EUV light, a technique using a dark field inspection image.

In the defect inspection, to detect even minute phase defect with good sensitivity, an intensity of scattered light from the portion not including a defect in the formed multilayer reflection film, i.e., background level (BGL), must be reduced. Therefore, whereas it is advantageous that the EUV mask has a higher reflectance with respect to the exposure light (at about 13.5 nm), the background level for the defect detection using the exposure light must be reduced.

The present invention has been made to solve the above problems, and an object of the present invention is to provide a reflective mask blank including a multilayer reflection film having a high reflectance with respect to EUV light and a controlled low background level, and a method for manufacturing a reflective mask with using the reflective mask blank.

In case of a periodically laminated structure in which molybdenum (Mo) layers and silicon (Si) layers are alternately laminated, a molybdenum layer not containing additive elements such as nitrogen (N), carbon (C), boron (B) and other elements tends to have a high reflectance. However, when the molybdenum layer does not contain the additive elements, the layer having a structure including crystal grains is formed, thus, the background level in the defect inspection with EUV light tends to increase due to the crystal grains.

On the other hand, to reduce the background level in the defect inspection with EUV light, it is effective to form an amorphas structure by adding additive elements such as nitrogen (N), carbon (C), boron (B) and other elements to the molybdenum (Mo) layer. However, when the additive elements are added, the reflectance of the layer tends to be reduced significantly by changes in optical properties (refractive index (n), extinction coefficient (k), and others) due to the influence of additive elements, and by intermixing at the interface between the molybdenum (Mo) layer and the silicon (Si) layer.

With respect to a multilayer reflection film of a reflective mask blank that has a periodically laminated structure in which low-refractive index layers composed of a material containing molybdenum (Mo) and high-refractive index layers are alternately laminated, the inventers found that, when the low-refractive index layer is constituted of a first low-refractive index sublayer containing molybdenum (Mo), and one or more elements selected from the group consisting of nitrogen (N), carbon (C), hydrogen (H) and boron (B), and a second low-refractive index sublayer containing either of both of molybdenum (Mo) and carbon, and is free of nitrogen (N), hydrogen (H) and boron (B) and having a thickness of not less than 0.1 nm and not more than 0.5 nm, and when either or both of the low-refractive index sublayers that are in contact with the high-refractive index layer are the second low-refractive index sublayer, the reflective mask blank includes a multilayer reflection film having a high reflectance with respect to EUV light and a controlled low background level in inspection of a phase defect by ABI (Actinic Blank Inspection) or the like.

In one aspect, the invention provides a reflective mask blank which is a material for a reflective mask used in EUV lithography using EUV light as exposure light, including a substrate, a multilayer reflection film that is formed on one main surface of the substrate and reflects the exposure light, a protection film formed in contact with the multilayer reflection film, and an absorber film that is formed on the protection film and absorbs the exposure light, wherein
the multilayer reflection film has a periodically laminated structure in which low-refractive index layers composed of a material containing molybdenum (Mo) and high-refractive index layers are alternately laminated,
the low-refractive index layer consists of one or more of first low-refractive index sublayers, and one or more of second low-refractive index sublayers that have a different composition from a composition of the first low-refractive index sublayer,
the first low-refractive index sublayer contains molybdenum (Mo), and one or more elements selected from the group consisting of nitrogen (N), carbon (C), hydrogen (H) and boron (B),
the second low-refractive index sublayer contains either of both of molybdenum (Mo) and carbon, and is free of nitrogen (N), hydrogen (H) and boron (B),
the second low-refractive index sublayer has a thickness of not less than 0.1 nm and not more than 0.5 nm, and
in the low-refractive index layer, either or both of the low-refractive index sublayers that are in contact with the high-refractive index layer are the second low-refractive index sublayer.

Preferably, the low-refractive index layer includes an amorphous.

Preferably, the second low-refractive index sublayer has a higher compression stress compared with a stress of the first low-refractive index sublayer.

Preferably, the second low-refractive index sublayer is a layer that satisfies the following expression (1):

$$\Delta TIR < 7xt \qquad (1)$$

wherein $\Delta TIR$ nm is an amount of warpage of a $SiO_2$—$TiO_2$-based glass substrate that is caused by a stress of the second low-refractive index sublayer when the second low-refractive index sublayer having a thickness of "t" nm is formed on a main surface of the $SiO_2$—$TiO_2$-based glass substrate having dimensions of 152 mm-square and 6.35 mm-thick.

Preferably, the high-refractive index layer is composed of a material containing silicon (Si).

Preferably, the high-refractive index layer consists of one or more of first high-refractive index sublayers, and one or more of second high-refractive index sublayers,
the first high-refractive index sublayer contains silicon (Si), and one or more elements selected from the group consisting of nitrogen (N), carbon (C), hydrogen (H) and boron (B),
the first high-refractive index sublayer has a thickness of not less than 0.1 nm and not more than 0.7 nm, and
the second high-refractive index sublayer contains silicon (Si), and is free of nitrogen (N), carbon (C), hydrogen (H) and boron (B).

Preferably, in the high-refractive index layer, a high-refractive index sublayer that is remote from the substrate and in contact with the low-refractive index layer is the first high-refractive index sublayer.

In another aspect, the invention provides a method for manufacturing a reflective mask blank with using the reflective mask blank.

Advantageous Effects of the Invention

The present invention can provide a reflective mask blank that includes a multilayer reflection film having a high reflectance with respect to EUV light and a controlled low background level in inspection of a phase defect by ABI (Actinic Blank Inspection) or the like. Further, from the reflective mask blank, the present invention can provide a reflective mask in which defects such as phase defects are reduced.

BRIEF DESCRIPTION OF THE DRAWINGS

FIG. 1 is a cross-sectional view illustrating an example of a reflective mask blank of the invention.

DESCRIPTION OF THE PREFERRED EMBODIMENT

A reflective mask blank of the invention includes a substrate, a multilayer reflection film that is formed on one main surface of the substrate and reflects exposure light, a protection film formed in contact with the multilayer reflection film, and an absorber film that is formed on the protection film and absorbs the exposure light. The reflective mask blank of the invention is suitable for a material (an EUV mask blank) for a reflective mask (an EUV mask) which is used in EUV lithography using EUV light as exposure light. An EUV light used in EUV lithography using EUV light as exposure light has a wavelength of 13 to 14 nm, generally, a wavelength of around 13.5 nm.

A typical example of the reflective mask blank of the invention is described. FIG. 1 is a cross-sectional view illustrating an example of a reflective mask blank of the invention. This reflective mask blank 10 includes a multilayer reflection film 12 that is formed on one main surface of a substrate 11 and is contact with the one main surface of the substrate 11, a protection film 13 that is formed in contact with the multilayer reflection film 12, and an absorber film 14 that is formed in contact with the protection film 13.

For EUV light exposure, the substrate preferably has low-thermal expansion property. The substrate is composed of a material having a coefficient of thermal expansion within a range of preferably $\pm 2 \times 10^{-8}/°C$., more preferably $\pm 5 \times 10^{-9}/°C$. Further, a substrate having a sufficiently flatted surface is preferably used. A surface roughness of the main surface of the substrate is, for example, as an RMS, is preferably not more than 0.5 nm, more preferably not more than 0.2 nm. Such a surface roughness can be obtained by polishing of the substrate. Examples of the material for the substrate include titania-doped quartz glasses ($SiO_2$—$TiO_2$-based glasses).

The multilayer reflection film is a film that reflects EUV light as exposure light in the reflective mask. The multilayer reflection film may be formed in contact with one main surface of the substrate, or with an underlaying film intervening between the substrate and the multilayer reflection film. In the invention, the multilayer reflection film consists of a plurality of layers in which low-refractive index layers and high-refractive index layers are alternately laminated, and has a periodically laminated structure in which the low-refractive index layers and the high-refractive index layers are alternately laminated. The low-refractive index layer is preferably composed of a material containing molybdenum (Mo). Further, the low-refractive index layer preferably consists of a first low-refractive index sublayer and a second low-refractive index sublayer. The low-refractive index layer preferably includes one or more of the first low-refractive index sublayers, and one or more of the second low-refractive index sublayers, respectively.

The first low-refractive index sublayer is composed of a material containing molybdenum (Mo), and one or more elements selected from the group consisting of nitrogen (N), carbon (C), hydrogen (H) and boron (B). On the other hand, the second low-refractive index sublayer is composed of a material containing either of both of molybdenum (Mo) and carbon (C), and is free of nitrogen (N), hydrogen (H) and boron (B), and having a different composition from a composition of the first low-refractive index sublayer (having a composition in which constituent elements are different, or constituent elements are the same, however, at least one content (component ratio) of the constituent element is different). Each of the first low-refractive index sublayer and the second low-refractive index sublayer may contains an inert gas (rare gas) such as helium (He), argon (Ar), krypton (Kr) and Xenon (Xe) in a small amount. Further, the first low-refractive index sublayer and the second low-refractive index sublayer have the same constituent elements, the second low-refractive index sublayer may be composed of a material containing not less than 98 at % of molybdenum (Mo) or not less than 98 at % of carbon (C), and the first low-refractive index sublayer may be composed of a material having at least one content (component ratio) of the constituent element different from the second low-refractive index sublayer, particularly, a material having a content of less than 98 at % in the total of molybdenum (Mo) and carbon (C).

The first low-refractive index sublayer has a thickness of preferably not less than 2.1 nm, more preferably not less than 2.2 nm, and preferably not more than 2.8 nm, more preferably not more than 2.7 nm. On the other hand, the second low-refractive index sublayer has a thickness of preferably not less than 0.1 nm, and preferably not more than 0.5 nm. Further, the whole of the low-refractive index layer (one low-refractive index layer) has a thickness of preferably not less than 2.6 nm, more preferably not less than 2.7 nm, and preferably not more than 3 nm, more preferably not more than 2.9 nm.

In the case that the low-refractive index layer consists of two or more sublayers, the low-refractive index layer has one or two low-refractive index sublayers (the first low-refractive index sublayer and/or the second low-refractive index sublayer) that are in contact with the high-refractive index layer located at the substrate side and/or the side remote from the substrate. In this case, in the low-refractive index layer, either or both of the low-refractive index sublayers that are in contact with the high-refractive index layer are preferably the second low-refractive index sublayer.

The low-refractive index layer in the multilayer reflection film preferably has an amorphous structure, and either of both of the first low-refractive index sublayer and the second low-refractive index sublayer preferably have an amorphous structure, particularly, the whole of the low-refractive index layer preferably has an amorphous structure.

When the low-refractive index layer includes the first low-refractive index sublayer composed of a material containing molybdenum (Mo), and one or more elements selected from the group consisting of nitrogen (N), carbon (C), hydrogen (H) and boron (B), the low-refractive index layer may be formed so as to have an amorphous structure included in the first low-refractive index sublayer. Further, when the low-refractive index layer includes the second low-refractive index sublayer composed of a material containing either of both of molybdenum (Mo) and carbon, and is free of nitrogen (N), hydrogen (H) and boron (B), the low-refractive index layer may be formed so as to have a dense structure included in the second low-refractive index sublayer. Particularly, when the second low-refractive index sublayer has a thickness of not more than 0.5 nm, the second low-refractive index sublayer having an amorphous structure may also be formed, and the whole of the low-refractive index layer may have an amorphous structure by the combination of the first and second low-refractive index sublayers. Moreover, when the second low-refractive index sublayer in the low-refractive index layer contacts to the high-refractive index layer, intermixing formed at the interface between the low-refractive index layer and the high-refractive index layer is suppressed, and the background level (BGL) is reduced without decreasing the reflectance with respect to exposure light.

The second low-refractive index sublayer preferably has a higher compression stress compared with a stress of the first low-refractive index sublayer. Further, the second low-refractive index sublayer is preferably a layer that satisfies the following expression (1):

$$\Delta TIR < 7 \times t \tag{1}$$

wherein $\Delta TIR$ nm is an amount of warpage of a $SiO_2$—$TiO_2$-based glass substrate that is caused by a stress of the second low-refractive index sublayer when the second low-refractive index sublayer having a thickness of "t" nm is formed on a main surface of the $SiO_2$—$TiO_2$-based glass substrate having dimensions of 152 mm-square and 6.35 mm-thick.

On the other hand, the high-refractive index layer is preferably composed of a material containing silicon (Si). Further, the high-refractive index layer preferably consists of a first high-refractive index sublayer and a second high-refractive index sublayer. The high-refractive index layer preferably one or more of the first high-refractive index sublayers, and one or more of the second high-refractive index sublayers, respectively.

The first high-refractive index sublayer is composed of a material containing silicon (Si), and one or more elements selected from the group consisting of nitrogen (N), carbon (C), hydrogen (H) and boron (B). On the other hand, the second high-refractive index sublayer is composed of a material containing silicon (Si), and is free of nitrogen (N), carbon (C), hydrogen (H) and boron (B), and having a different composition from a composition of the first high-refractive index sublayer (having a composition in which constituent elements are different, or constituent elements are the same, however, at least one content (component ratio) of the constituent element is different).

The first high-refractive index sublayer has a thickness of preferably not less than 0.1 nm, and preferably not more than 0.7 nm. On the other hand, the second high-refractive index sublayer has a thickness of preferably not less than 3.1 nm, more preferably not less than 3.3 nm, and preferably not more than 4.4 nm, more preferably not more than 4.2 nm. Further, the whole of the high-refractive index layer (one high-refractive index layer) has a thickness of preferably not less than 3.8 nm, more preferably not less than 4 nm, and preferably not more than 4.5 nm, more preferably not more than 4.3 nm.

In the case that the high-refractive index layer consists of two or more sublayers, the high-refractive index layer has one or two high-refractive index sublayers (the first high-refractive index sublayer and/or the second high-refractive index sublayer) that are in contact with the low-refractive index layer located at the substrate side and/or the side remote from the substrate. In this case, in the high-refractive index layer, either or both of the high-refractive index sublayers that are in contact with the low-refractive index layer are preferably the first high-refractive index sublayer. In the case of the high-refractive index layer, in the high-refractive index layer, a high-refractive index sublayer that is in contact with the low-refractive index layer and remote from the substrate is preferably the first high-refractive index sublayer.

In the high-refractive index layer, when a high-refractive index sublayer that is in contact with the low-refractive index layer and remote from the substrate is the first high-refractive index sublayer, intermixing formed at the interface between the high-refractive index layer and the low-refractive index layer is suppressed, and the background level (BGL) is reduced without decreasing the reflectance with respect to exposure light.

The multilayer reflection film has a thickness of preferably not less than 260 nm, more preferably not less than 270 nm, and preferably not more than 300 nm, more preferably not more than 290 nm.

Examples of method for forming the multilayer reflection film include a sputtering method in which, to perform sputtering, power is supplied to a target, and plasma of an atmospheric gas is formed (an atmospheric gas is ionized) by the supplied power, and an ion beam sputtering method in which a target is irradiated with ion beam. The sputtering methods include a DC sputtering method in which a DC voltage is applied to a target, and an RF sputtering method in which a high frequency voltage is applied to a target. The sputtering method is a film forming method that utilizes sputtering phenomenon caused by gas ions generated by applying a voltage to a target with feeding a sputtering gas into a chamber to ionize the gas. Particularly, a magnetron sputtering method has an advantage in productivity. The power may be applied to the target by a DC system or an RF system. The DC system also includes a pulse sputtering that inverts a negative bias applied to the target for a short time to prevent charge-up of the target.

The multilayer reflection film may be formed by, for example, a sputtering method using a sputtering apparatus to which a plurality of targets can be attached. In particular, the multilayer reflection film may be formed by using, as a target, a target appropriately selected from the group consisting of a molybdenum (Mo) target for forming a molybdenum (Mo)-containing layer, a silicon (Si) target for forming a silicon (Si)-containing target, and a carbon (C) target for forming a carbon (C)-containing target, and using, as a sputtering gas, a rare gas such as helium (He) gas, argon (Ar) gas, krypton (Kr) gas and xenon (Xe) gas. Further, the sputtering may be a reactive sputtering. In the case the reactive sputtering, for example, a nitrogen-containing gas such as nitrogen gas ($N_2$ gas) to form a nitrogen (N)-containing film, a hydrogen-containing gas such as hydrogen gas ($H_2$ gas) to form a hydrogen (H)-containing film, or a hydrocarbon gas such as methane gas ($CH_4$ gas) to form a carbon (C) and hydrogen (H)-containing film may be used with the rare gas. Moreover, a molybdenum (Mo) target added with boron (B) (a molybdenum boride (MoB) target), a silicon (Si) target added with boron (B) (a silicon boride (SiB) target) to form a boron (B)-containing layer may be used.

When a layer containing a plurality of elements is formed, a desired composition, and desired physical properties such as crystallinity can be obtained by appropriately adjusting a power applied to the target (and a ratio of the powers when a plurality of targets are used), a flow rate of the reactive gas (and a ratio of the flow rates when a plurality of reactive gases are used), and other conditions. The sputtering may be performed in advance under various conditions to confirm the obtained composition and obtained physical properties so that the desired composition and desired physical properties such as crystallinity can be obtained.

The protection film is also called a capping layer, and formed to protect the multilayer reflection film when the absorber film on the protection film is patterned or a pattern of the absorber film is corrected. A material for the protection film is preferably a material containing ruthenium (Ru). Aa the material containing ruthenium (Ru), ruthenium simple substance, or a composition of ruthenium (Ru) added with niobium (Nb) or zirconium (Zr) is preferably used. The protection film has a thickness of normally not more than 5 nm, particularly not more than 4 nm. A lower limit of the thickness of the protection film is normally not less than 2 nm.

As same as the multilayer reflection film, the protection film can be formed by a sputtering method such as an ion beam sputtering method or a magnetron sputtering method.

The protection film may be formed by, for example, a sputtering method using a sputtering apparatus to which one or a plurality of targets can be attached. In particular, the protection film may be formed by sputtering using a target selected from the group consisting of a ruthenium (Ru) target, a ruthenium (Ru) target added with niobium (Nb) or zirconium (Zr), and an optional target of at least one element selected from the group consisting of niobium (Nb) and zirconium (Zr), and using, as a sputtering gas, a rare gas such as helium (He) gas, argon (Ar) gas, krypton (Kr) gas and xenon (Xe) gas.

When the protection film is formed of a compound containing an element other than a metal, the protection film can be formed by reactive sputtering using, as a sputtering gas, a reactive gas such as an oxygen-containing gas, a nitrogen-containing gas, or a carbon-containing gas with the rare gas. Further, the target may be a compound.

The reflective mask blank of the invention includes an absorber film that absorbs exposure light, in particular, absorbs EUV light and lowers the reflectance. The absorber film is preferably provided in contact with the protection film. The reflective mask blank may further include a hard mask film on the absorber film that acts as an etching mask when the absorber film is dry-etched. On the other hand, a conductive film used for electrostatically chucking the reflective mask to an exposure apparatus may be provided under the other main surface (back surface), which is the surface opposite to the one main surface of the substrate, preferably provided in contact with the other main surface. A reflective mask (an EUV mask) having an absorber pattern (a pattern of absorber film) formed by patterning the absorber film is manufactured from a reflective mask blank (an EUV mask blank).

The absorber film is formed on the multilayer reflection film and absorbs EUV light, which is exposure light, and is a film to reduce the reflectance of the exposure light. In the reflective mask, a transfer pattern is formed by the difference in reflectance between the portion where the absorber film is formed and the portion where the absorber film is not formed.

A material of the absorber film is not limited as long as a material can absorb EUV light and is processible to a pattern. Examples of the material of the absorber film include, for example, a material containing tantalum (Ta) or chromium (Cr). The material containing Ta or Cr may contain oxygen (O), nitrogen (N), carbon (C), boron (B), or other elements. Examples of the material containing Ta include, for example, Ta simple substance, and a tantalum compound such as TaO, TaN, TaON, TaC, TaCN, TaCO, TaCON, TaB, TaOB, TaNB, TaONB, TaCB, TaCNB, TaCOB and TaCONB. Examples of the material containing Cr include, for example, Cr simple substance, and a chromium compound such as CrO, CrN, CrON, CrC, CrCN, CrCO, CrCON, CrB, CrOB, CrNB, CrONB, CrCB, CrCNB, CrCOB and CrCONB.

The absorber film can be formed by a sputtering method, and the sputtering is preferably a magnetron sputtering. In particular, the absorber film is formed by a sputtering using a metal target such as a chromium (Cr) target and a tantalum (Ta) target or a metal compound target such as a chromium compound target and a tantalum compound target (a target containing a metal such as Cr and Ta, and at least one element selected from the group consisting of oxygen (O), nitrogen (N), carbon (C) and boron (B)), and using, as a sputtering gas, a rare gas such as helium (He) gas, argon (Ar) gas, krypton (Kr) gas and xenon (Xe) gas, or a reactive sputtering using the target, and the rare gas with a reactive gas such as an oxygen-containing gas, a nitrogen-containing gas and a carbon-containing gas. A thickness of the absorber film is normally about 50 to 90 nm, however, not limited thereto.

On the side remote from the substrate of absorber film, a hard mask film (an etching mask film for the absorber film) having different etching properties from the absorber film may be provided, preferably in contact with the absorber film. The hard mask film is a film that acts as an etching mask when an absorber film is dry-etched. After the absorber pattern is formed, the hard mask film may be left as the reflectance reducing film for reducing the reflectance at the wavelength of light used in inspections such as pattern inspection as a part of the absorber film, or removed to be absent on the reflective mask. Examples of the material of the hard mask film include a material containing chromium (Cr). A hard mask film composed of a material containing Cr is more preferable in case that the absorber film is composed of a material containing Ta and free of Cr. When a layer that mainly assumes a function for reducing the reflectance at the wavelength of light used in inspection such as pattern inspection (a reflectance reducing layer) is formed on the absorber film, the hard mask film may be formed on the reflectance reducing film of the absorber film. The hard mask film may be formed by, for example, a magnetron sputtering method. A thickness of the hard mask is normally about 5 to 20 nm, however, not limited thereto.

A sheet resistance of the conductive film is preferably not more than 100Ω/□ (ohms per square), and a material of the conductive film are not particularly limited. Examples of the material of the conductive film include, for example, a material containing tantalum (Ta) or chromium (Cr). The material containing Ta or Cr may contain oxygen (O), nitrogen (N), carbon (C), boron (B), or other elements. Examples of the material containing Ta include, for example, Ta simple substance, and a tantalum compound such as TaO, TaN, TaON, TaC, TaCN, TaCO, TaCON, TaB, TaOB, TaNB, TaONB, TaCB, TaCNB, TaCOB and TaCONB. Examples of the material containing Cr include, for example, Cr simple substance, and a chromium compound such as CrO, CrN, CrON, CrC, CrCN, CrCO, CrCON, CrB, CrOB, CrNB, CrONB, CrCB, CrCNB, CrCOB and CrCONB.

A thickness of the conductive film is not particularly limited as long as the conductive film has a function for electrostatic chuck use. The thickness is normally about 20 to 300 nm. The thickness of the conductive film is preferably formed so that a film stress is balanced with the multilayer reflection film and the absorber pattern after a reflective mask is obtained, that is, after the absorber pattern is formed. The conductive film may be formed before forming the multilayer reflection film, or after forming all of the films disposed at the side of the multilayer reflection film on the substrate. Further, the conductive film may be formed after forming a part of the films disposed at the side of the multilayer reflection film on the substrate, and the remainder of the films disposed at the side of the multilayer reflection film on the substrate may be formed after forming the conductive film. The conductive film may be formed by, for example, a magnetron sputtering method.

Further, the reflective mask blank may include a resist film formed on the side remotest from the substrate. The resist film is preferably an electron beam (EB) resist.

EXAMPLES

Examples of the invention are given below by way of illustration and not by way of limitation.

Experimental Example 1

A multilayer reflection film was formed on main surface of a low-thermal expansion substrate ($SiO_2$—$TiO_2$-based glass substrate) having dimensions of 152 mm-square and 6.35 mm-thick while rotating the substrate by DC pulse magnetron sputtering with using a molybdenum (Mo) target and a silicon (Si) target that were placed to face to the main surface of the substrate. Each of the targets was attached to a sputtering apparatus that is capable of attaching the molybdenum (Mo) target and the silicon (Si) target and discharging the targets individually, or two or more of the targets at the same time, and the substrate was placed into the sputtering apparatus.

First, as a second high-refractive index sublayer, a silicon (Si) layer having a thickness of 3.7 nm was formed under sputtering pressure of 0.025 Pa with applying electric power to the silicon (Si) target while feeding argon (Ar) gas (flow rate: 12 sccm) into a chamber. Next, as a first high-refractive index sublayer, a silicon nitride (SiN) layer having a thickness of 0.5 nm was formed under sputtering pressure of 0.15 Pa with applying electric power to the silicon (Si) target while feeding argon (Ar) gas (flow rate: 12 sccm) and nitrogen (N₂) gas (flow rate: 50 sccm) into the chamber, then, the application of electric power to the silicon (Si) target was terminated. Accordingly, a high-refractive index layer consisting of two layers of the second high-refractive index sublayer and the first high-refractive index sublayer was formed. The composition of the silicon nitride (SiN) layer was Si:N=48:52(atomic ratio). The composition was analyzed by ESCA (the same in the following composition analysis).

Next, as a second low-refractive index sublayer, a molybdenum (Mo) layer having a thickness of 0.3 nm was formed under sputtering pressure of 0.026 Pa with applying electric power to the molybdenum (Mo) target while feeding argon (Ar) gas (flow rate: 13 sccm) into the chamber. Next, as a first low-refractive index sublayer, a molybdenum nitride (MoN) layer having a thickness of 2.5 nm was formed under sputtering pressure of 0.027 Pa with applying electric power to the molybdenum (Mo) target while feeding argon (Ar) gas (flow rate: 13 sccm) and nitrogen (N₂) gas (flow rate: 2 sccm) into the chamber, then, the application of electric power to the molybdenum (Mo) target was terminated. Accordingly, a low-refractive index layer consisting of two layers of the second low-refractive index sublayer and the first low-refractive index sublayer was formed. In this case, the composition of the molybdenum nitride (MoN) layer was set to low nitrogen content within a range which can form an amorphous structure since higher the nitrogen content tends to be lower the reflectance of the multilayer reflection film. The composition of the molybdenum nitride (MoN) layer was Mo:N=97:3 (atomic ratio).

Further, other two low-thermal expansion substrates (SiO₂—TiO₂-based glass substrates) having dimensions of 152 mm-square and 6.35 mm-thick were prepared. A molybdenum (Mo) layer and a molybdenum nitride (MoN) layer having a thickness of 20 to 60 nm, respectively, were formed on main surfaces of the substrates under the same forming conditions of the previously formed molybdenum (Mo) layer and molybdenum nitride (MoN) layer. Warpages (TIR) of the substrate before and after forming of each layer were measured by Photomask Form Analysis System Ultra-Flat200-ERA (manufactured by Corning Tropel), and ΔTIR (nm), which is a difference between amounts of warpage before and after forming the layer, was calculated from the warpages (TIR) of the substrate. Values of ΔTIR/t, which is ΔTIR divided by the thickness t (nm) of the layer, were 7.3 in the molybdenum (Mo) layer and 6.3 in the molybdenum nitride (MoN) layer. The molybdenum (Mo) layer had a higher compression stress than the molybdenum nitride (MoN) layer.

The one cycle which is a set of the formations of the high-refractive index layer and the low-refractive index layer was repeated for 40 cycles to form 40 layers of the high-refractive index layer and the low-refractive index layer, respectively. Finally, a silicon (Si) layer having a thickness of 4.2 nm was formed under sputtering pressure of 0.025 Pa with applying electric power to the silicon (Si) target while feeding argon (Ar) gas (flow rate: 12 sccm) into the chamber, then, the application of electric power to the silicon (Si) target was terminated. Accordingly, a high-refractive index layer consisting of a single layer was formed.

Next, a protection film was formed in contact with the multilayer reflection film while rotating the substrate by DC pulse magnetron sputtering with using a ruthenium (Ru) target that was placed to face to the main surface of the substrate. The ruthenium (Ru) target was attached to another sputtering apparatus that differs from the sputtering apparatus in which the multilayer reflection film was formed, and the substrate having the formed multilayer reflection film was transported without taking it out to the atmosphere, from the sputtering apparatus in which the multilayer reflection film was formed, through a transport path which was maintained vacuum condition, to the other sputtering apparatus to which the ruthenium (Ru) target was attached, and was placed into the sputtering apparatus.

A ruthenium (Ru) film having a thickness of 2.0 nm was formed under sputtering pressure of 0.023 Pa with applying electric power to the ruthenium (Ru) target while feeding argon (Ar) gas (flow rate: 10 sccm) into a chamber, then, the application of electric power to the ruthenium (Ru) target was terminated. Accordingly, a protection film consisting of a single layer was formed.

Next, EUV light (wavelength of 13 to 14 nm) was irradiated to the multilayer reflection film and the protection film on the substrate from the protective film side at an incident angle of 6°, and a reflectance was measured by EUV mask fully automatic reflectance meter LPR-1016 (manufactured by EUV Tech). As a result, a maximum reflectance was measured at a wavelength (center wavelength) of 13.53±0.05 nm, and the maximum reflectance was 64.61%.

Further, EUV light (wavelength of 13 to 14 nm) was irradiated to the multilayer reflection film and the protection film on the substrate from the protective film side, and a background level (BGL) of the multilayer reflection film was measured by an inspection device for inspection of a phase defect (Actinic Blank Inspection) using EUV light as inspection light. As a result, the BGL was 402.

Further, from the substrate on which the multilayer reflection film and the protection film had been formed, a cross section having a thickness of about 70 nm in the thickness direction and including, within the range of the thickness, a part of the substrate and the whole of the multilayer reflection film and the protection film was cut out by a focused ion beam (FIB) device Helios G4 CX (manufactured by FEI Company). An electron microscope image of the cross section was obtained by a transmission electron microscope (TEM) device ARM200F (manufactured by JEOL Ltd.), and crystal structures (crystallineities) of the molybdenum (Mo) layer (the second low-refractive index sublayer) and the molybdenum nitride (MoN) layer (the first low-refractive index sublayer) were evaluated. As a result, each of the first low-refractive index sublayer and the second low-refractive index sublayer was amorphous.

Experimental Example 2

Except that the formation of the low-refractive index layer was altered as follows, a multilayer reflection film and a protection film were formed on a substrate, the reflectance and the BGL were measured, and the crystal structures (crystallineities) were evaluated, as the same manner in Experimental Example 1.

As a first low-refractive index sublayer, a molybdenum nitride (MoN) layer having a thickness of 2.5 nm was formed under sputtering pressure of 0.027 Pa with applying electric power to the molybdenum (Mo) target while feeding argon (Ar) gas (flow rate: 13 sccm) and nitrogen (N₂) gas (flow rate: 2 sccm) into the chamber. Next, as a second low-refractive index sublayer, a molybdenum (Mo) layer having a thickness of 0.3 nm was formed under sputtering pressure of 0.026 Pa with applying electric power to the molybdenum (Mo) target while feeding argon (Ar) gas (flow rate: 13 sccm) into the chamber, then, the application of electric power to the molybdenum (Mo) target was terminated. Accordingly, a low-refractive index layer consisting of two layers of the first low-refractive index sublayer and the second low-refractive index sublayer was formed. The composition of the molybdenum nitride (MoN) layer was Mo:N=97:3 (atomic ratio).

As a result, a maximum reflectance was measured at a wavelength (center wavelength) of 13.53±0.05 nm, the maximum reflectance was 64.55%, and the BGL was 405. Further, each of the first low-refractive index sublayer and the second low-refractive index sublayer was amorphous.

Experimental Example 3

Except that the formation of the low-refractive index layer was altered as follows, a multilayer reflection film and a protection film were formed on a substrate, the reflectance and the BGL were measured, and the crystal structures (crystallineities) were evaluated, as the same manner in Experimental Example 1.

As a second low-refractive index sublayer, a molybdenum (Mo) layer having a thickness of 0.3 nm was formed under sputtering pressure of 0.026 Pa with applying electric power to the molybdenum (Mo) target while feeding argon (Ar) gas (flow rate: 13 sccm) into the chamber. Next, as a first low-refractive index sublayer, a molybdenum nitride (MoN) layer having a thickness of 2.5 nm was formed under sputtering pressure of 0.027 Pa with applying electric power to the molybdenum (Mo) target while feeding argon (Ar) gas (flow rate: 13 sccm) and nitrogen ($N_2$) gas (flow rate: 2 sccm) into the chamber. Next, as a second low-refractive index sublayer, a molybdenum (Mo) layer having a thickness of 0.3 nm was formed under sputtering pressure of 0.026 Pa with applying electric power to the molybdenum (Mo) target while feeding argon (Ar) gas (flow rate: 13 sccm) into the chamber, then, the application of electric power to the molybdenum (Mo) target was terminated. Accordingly, a low-refractive index layer consisting of three layers of the second low-refractive index sublayer, the first low-refractive index sublayer, and the second low-refractive index sublayer was formed. The composition of the molybdenum nitride (MoN) layer was Mo:N=97:3 (atomic ratio).

As a result, a reflectance, a maximum reflectance was measured at a wavelength (center wavelength) of 13.53±0.05 nm, the maximum reflectance was 64.75%, and the BGL was 423. Further, each of the first low-refractive index sublayer and the second low-refractive index sublayers was amorphous.

Experimental Example 4

A multilayer reflection film was formed on main surface of a low-thermal expansion substrate ($SiO_2$—$TiO_2$-based glass substrate) having dimensions of 152 mm-square and 6.35 mm-thick while rotating the substrate by DC pulse magnetron sputtering with using a molybdenum (Mo) target, a silicon (Si) target and a carbon (C) target that were placed to face to the main surface of the substrate. Each of the targets was attached to a sputtering apparatus that is capable of attaching the molybdenum (Mo) target, the silicon (Si) target and the carbon (C) target and discharging the targets individually, or two or more of the targets at the same time, and the substrate was placed into the sputtering apparatus.

First, a silicon (Si) layer having a thickness of 4.2 nm was formed under sputtering pressure of 0.025 Pa with applying electric power to the silicon (Si) target while feeding argon (Ar) gas (flow rate: 12 sccm) into a chamber, then, the application of electric power to the silicon (Si) target was terminated. Accordingly, a high-refractive index layer consisting of a single layer was formed.

Next, as a second low-refractive index sublayer, a carbon (C) layer having a thickness of 0.25 nm was formed under sputtering pressure of 0.020 Pa with applying electric power to the carbon (C) target while feeding argon (Ar) gas (flow rate: 10 sccm) into the chamber. Next, as a first low-refractive index sublayer, a molybdenum carbide (MoC) layer having a thickness of 2.55 nm was formed under sputtering pressure of 0.026 Pa with applying electric powers to the molybdenum (Mo) target and the carbon (C) target while feeding argon (Ar) gas (flow rate: 13 sccm) into the chamber, then, the application of electric powers to the molybdenum (Mo) target and the carbon (C) target was terminated. Accordingly, a low-refractive index layer consisting of two layers of the second low-refractive index sublayer and the first low-refractive index sublayer was formed. In this case, the composition of the molybdenum carbide (MoC) layer was set to low carbon content within a range which can form an amorphous structure. The composition of the molybdenum carbide (MoC) layer was Mo:C=97:3 (atomic ratio).

Further, other two low-thermal expansion substrates ($SiO_2$—$TiO_2$-based glass substrates) having dimensions of 152 mm-square and 6.35 mm-thick were prepared. A carbon (C) layer and a molybdenum carbide (MoC) layer having a thickness of 20 to 60 nm, respectively, were formed on main surfaces of the substrates under the same forming conditions of the previously formed carbon (C) layer and molybdenum carbide (MoC) layer. Warpages (TIR) of the substrate before and after forming of each layer were measured by Photomask Form Analysis System Ultra-Flat200-ERA (manufactured by Corning Tropel), and ΔTIR (nm), which is a difference between amounts of warpage before and after forming the layer, was calculated from the warpages (TIR) of the substrate. Values of ΔTIR/t, which is ΔTIR divided by the thickness t (nm) of the layer, were 10.0 in the carbon (C) layer and 6.1 in the molybdenum carbide (MoC) layer. The carbon (C) layer had a higher compression stress than the molybdenum carbide (MoC) layer.

The one cycle which is a set of the formations of the high-refractive index layer and the low-refractive index layer was repeated for 40 cycles to form 40 layers of the high-refractive index layer and the low-refractive index layer, respectively. Finally, a silicon (Si) layer having a thickness of 4.2 nm was formed under sputtering pressure of 0.025 Pa with applying electric power to the silicon (Si) target while feeding argon (Ar) gas (flow rate: 12 sccm) into the chamber, then, the application of electric power to the silicon (Si) target was terminated. Accordingly, a high-refractive index layer consisting of a single layer was formed.

Next. a protection film was formed in contact with the multilayer reflection film while rotating the substrate by DC pulse magnetron sputtering with using a ruthenium (Ru) target that was placed to face to the main surface of the substrate. The ruthenium (Ru) target was attached to another sputtering apparatus that differs from the sputtering apparatus in which the multilayer reflection film was formed, and the substrate having the formed multilayer reflection film was transported without taking it out to the atmosphere, from the sputtering apparatus in which the multilayer reflection film was formed, through a transport path which was maintained vacuum condition, to the other sputtering apparatus to which the ruthenium (Ru) target was attached, and was placed into the sputtering apparatus.

A ruthenium (Ru) film having a thickness of 2.0 nm was formed under sputtering pressure of 0.023 Pa with applying electric power to the ruthenium (Ru) target while feeding argon (Ar) gas (flow rate: 10 sccm) into a chamber, then, the application of electric power to the ruthenium (Ru) target was terminated. Accordingly, a protection film consisting of a single layer was formed.

The reflectance and the BGL were measured, and the crystal structures (crystallineities) were evaluated, as the same manner in Experimental Example 1. As a result, a maximum reflectance was measured at a wavelength (center wavelength) of 13.53±0.05 nm, the maximum reflectance was 65.02%, and the BGL was 390. Further, each of the first low-refractive index sublayer and the second low-refractive index sublayers was amorphous.

Experimental Example 5

Except that the formation of the low-refractive index layer was altered as follows, a multilayer reflection film and a protection film were formed on a substrate, the reflectance and the BGL were measured, and the crystal structures (crystallineities) were evaluated, as the same manner in Experimental Example 4.

As a first low-refractive index sublayer, a molybdenum carbide (MoC) layer having a thickness of 2.55 nm was formed under sputtering pressure of 0.026 Pa with applying electric powers to the molybdenum (Mo) target and the carbon (C) target while feeding argon (Ar) gas (flow rate: 13 sccm) into the chamber, then, the application of electric power to the molybdenum (Mo) target was terminated. Next, as a second low-refractive index sublayer, a carbon (C) layer having a thickness of 0.25 nm was formed under sputtering pressure of 0.020 Pa with applying electric power to the carbon (C) target while feeding argon (Ar) gas (flow rate: 10 sccm) into the chamber, then, the application of electric power to the carbon (C) target was terminated. Accordingly, a low-refractive index layer consisting of two layers of the first low-refractive index sublayer and the second low-refractive index sublayer was formed. The composition of the molybdenum carbide (MoC) layer was Mo:C=97:3 (atomic ratio).

As a result, a maximum reflectance was measured at a wavelength (center wavelength) of 13.53±0.05 nm, the maximum reflectance was 65.89%, and the BGL was 388. Further, each of the first low-refractive index sublayer and the second low-refractive index sublayer was amorphous.

Experimental Example 6

Except that the formation of the low-refractive index layer was altered as follows, a multilayer reflection film and a protection film were formed on a substrate, the reflectance and the BGL were measured, and the crystal structures (crystallineities) were evaluated, as the same manner in Experimental Example 4.

As a second low-refractive index sublayer, a carbon (C) layer having a thickness of 0.25 nm was formed under sputtering pressure of 0.020 Pa with applying electric power to the carbon (C) target while feeding argon (Ar) gas (flow rate: 10 sccm) into the chamber. Next, as a first low-refractive index sublayer, a molybdenum carbide (MoC) layer having a thickness of 2.3 nm was formed under sputtering pressure of 0.026 Pa with applying electric powers to the molybdenum (Mo) target and the carbon (C) target while feeding argon (Ar) gas (flow rate: 13 sccm) and into the chamber, then, the application of electric power to the molybdenum (Mo) target was terminated. Next, as a second low-refractive index sublayer, a carbon (C) layer having a thickness of 0.25 nm was formed under sputtering pressure of 0.020 Pa with applying electric power to the carbon (C) target while feeding argon (Ar) gas (flow rate: 10 sccm) into the chamber, then, the application of electric power to the carbon (C) target was terminated. Accordingly, a low-refractive index layer consisting of three layers of the second low-refractive index sublayer, the first low-refractive index sublayer, and the second low-refractive index sublayer was formed. The composition of the molybdenum carbide (MoC) layer was Mo:C=97:3 (atomic ratio).

As a result, a maximum reflectance was measured at a wavelength (center wavelength) of 13.53±0.05 nm, the maximum reflectance was 65.23%, and the BGL was 392. Further, each of the first low-refractive index sublayer and the second low-refractive index sublayers was amorphous.

Comparative Experimental Example 1

A multilayer reflection film was formed on main surface of a low-thermal expansion substrate ($SiO_2$—$TiO_2$-based glass substrate) having dimensions of 152 mm-square and 6.35 mm-thick while rotating the substrate by DC pulse magnetron sputtering with using a molybdenum (Mo) target and a silicon (Si) target that were placed to face to the main surface of the substrate. Each of the targets was attached to a sputtering apparatus that is capable of attaching the molybdenum (Mo) target and the silicon (Si) target and discharging the targets individually, or two or more of the targets at the same time, and the substrate was placed into the sputtering apparatus.

First, a silicon (Si) layer having a thickness of 4.2 nm was formed under sputtering pressure of 0.025 Pa with applying electric power to the silicon (Si) target while feeding argon (Ar) gas (flow rate: 12 sccm) into a chamber, then, the application of electric power to the silicon (Si) target was terminated. Accordingly, a high-refractive index layer consisting of a single layer was formed.

Next, a molybdenum (Mo) layer having a thickness of 2.8 nm was formed under sputtering pressure of 0.026 Pa with applying electric power to the molybdenum (Mo) target while feeding argon (Ar) gas (flow rate: 13 sccm) into the chamber, then, the application of electric power to the molybdenum (Mo) target was terminated.

Accordingly, a low-refractive index layer consisting of a single layer was formed. The one cycle which is a set of the formations of the high-refractive index layer and the low-refractive index layer was repeated for 40 cycles to form 40 layers of the high-refractive index layer and the low-refractive index layer, respectively. Finally, a silicon (Si) layer having a thickness of 4.2 nm was formed under sputtering pressure of 0.025 Pa with applying electric power to the silicon (Si) target while feeding argon (Ar) gas (flow rate: 12 sccm) into the chamber, then, the application of electric power to the silicon (Si) target was terminated. Accordingly, a high-refractive index layer consisting of a single layer was formed.

Next, a protection film was formed in contact with the multilayer reflection film while rotating the substrate by DC pulse magnetron sputtering with using a ruthenium (Ru) target that was placed to face to the main surface of the substrate. The ruthenium (Ru) target was attached to another sputtering apparatus that differs from the sputtering apparatus in which the multilayer reflection film was formed, and the substrate having the formed multilayer reflection film was transported without taking it out to the atmosphere, from the sputtering apparatus in which the multilayer reflection film was formed, through a transport path which was maintained vacuum condition, to the other sputtering apparatus to which the ruthenium (Ru) target was attached, and was placed into the sputtering apparatus.

A ruthenium (Ru) film having a thickness of 2.0 nm was formed under sputtering pressure of 0.023 Pa with applying electric power to the ruthenium (Ru) target while feeding argon (Ar) gas (flow rate: 10 sccm) into a chamber, then, the application of electric power to the ruthenium (Ru) target was terminated. Accordingly, a protection film consisting of a single layer was formed.

The reflectance and the BGL were measured, and the crystal structures (crystallineities) were evaluated, as the same manner in Experimental Example 1. As a result, a maximum reflectance was measured at a wavelength (center wavelength) of 13.53±0.05 nm, the maximum reflectance was 66.68%, and the BGL was 605. Further, the low-refractive index layer was crystalline.

Comparative Experimental Example 2

Except that the formation of the low-refractive index layer was altered as follows, a multilayer reflection film and a protection film were formed on a substrate, the reflectance and the BGL were measured, and the crystal structures (crystallineities) were evaluated, as the same manner in Comparative Experimental Example 1.

A molybdenum nitride (MoN) layer having a thickness of 2.8 nm was formed under sputtering pressure of 0.027 Pa with applying electric power to the molybdenum (Mo) target while feeding argon (Ar) gas (flow rate: 13 sccm) and nitrogen ($N_2$) gas (flow rate: 2 sccm) into the chamber, then, the application of electric power to the molybdenum (Mo) target was terminated. Accordingly, a low-refractive index layer consisting of a single layer was formed. The composition of the molybdenum nitride (MoN) layer was Mo:N=97:3 (atomic ratio).

As a result, a maximum reflectance was measured at a wavelength (center wavelength) of 13.53±0.05 nm, the maximum reflectance was 63.66%, and the BGL was 398. Further, the low-refractive index layer was amorphous.

Comparative Experimental Example 3

Except that the formation of the high-refractive index layer was altered as follows, a multilayer reflection film and a protection film were formed on a substrate, the reflectance and the BGL were measured, and the crystal structures (crystallineities) were evaluated, as the same manner in Comparative Experimental Example 1.

As a second high-refractive index sublayer, a silicon (Si) layer having a thickness of 3.7 nm was formed under sputtering pressure of 0.025 Pa with applying electric power to the silicon (Si) target while feeding argon (Ar) gas (flow rate: 12 sccm) into a chamber. Next, as a first high-refractive index sublayer, a silicon nitride (SiN) layer having a thickness of 0.5 nm was formed under sputtering pressure of 0.15 Pa with applying electric power to the silicon (Si) target while feeding argon (Ar) gas (flow rate: 12 sccm) and nitrogen ($N_2$) gas (flow rate: 50 sccm) into the chamber, then, the application of electric power to the silicon (Si) target was terminated. Accordingly, a high-refractive index layer consisting of two sublayers was formed. The composition of the silicon nitride (SiN) layer was Si:N=48:52 (atomic ratio).

As a result, a maximum reflectance was measured at a wavelength (center wavelength) of 13.53±0.05 nm, the maximum reflectance was 66.93%, and the BGL was was 605. Further, the low-refractive index layer was crystalline.

Japanese Patent Application No. 2021-101287 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A reflective mask blank which is a material for a reflective mask used in EUV lithography using EUV light as exposure light, comprising a substrate, a multilayer reflection film that is formed on one main surface of the substrate and reflects the exposure light, a protection film formed in contact with the multilayer reflection film, and an absorber film that is formed on the protection film and absorbs the exposure light, wherein
the multilayer reflection film has a periodically laminated structure in which low-refractive index layers composed of a material comprising molybdenum (Mo) and high-refractive index layers are alternately laminated,
the low-refractive index layer consists of one or more of first low-refractive index sublayers, and one or more of second low-refractive index sublayers that have a different composition from a composition of the first low-refractive index sublayer,
the first low-refractive index sublayer comprises molybdenum (Mo), and one or more elements selected from the group consisting of nitrogen (N), carbon (C), hydrogen (H) and boron (B),
the second low-refractive index sublayer comprises either of both of molybdenum (Mo) and carbon, and is free of nitrogen (N), hydrogen (H) and boron (B),
the second low-refractive index sublayer has a thickness of not less than 0.1 nm and not more than 0.5 nm, and
in the low-refractive index layer, either or both of the low-refractive index sublayers that are in contact with the high-refractive index layer are the second low-refractive index sublayer.

2. The reflective mask blank of claim 1 wherein the low-refractive index layer comprises an amorphous.

3. The reflective mask blank of claim 1 wherein the second low-refractive index sublayer has a higher compression stress compared with a stress of the first low-refractive index sublayer.

4. The reflective mask blank of claim 1 wherein the second low-refractive index sublayer is a layer that satisfies the following expression (1):

$$\Delta TIR < 7xt \tag{1}$$

wherein $\Delta TIR$ nm is an amount of warpage of a $SiO_2$—$TiO_2$-based glass substrate that is caused by a stress of the second low-refractive index sublayer when the second low-refractive index sublayer having a thickness of "t" nm is formed on a main surface of the $SiO_2$—$TiO_2$-based glass substrate having dimensions of 152 mm-square and 6.35 mm-thick.

5. The reflective mask blank of claim 1 wherein the high-refractive index layer is composed of a material comprising silicon (Si).

6. The reflective mask blank of claim 5 wherein the high-refractive index layer consists of one or more of first high-refractive index sublayers, and one or more of second high-refractive index sublayers, the first high-refractive index sublayer comprises silicon (Si), and one or more elements selected from the group consisting of nitrogen (N), carbon (C), hydrogen (H) and boron (B), the first high-refractive index sublayer has a thickness of not less than 0.1 nm and not more than 0.7 nm, and the second high-refractive index sublayer comprises silicon (Si), and is free of nitrogen (N), carbon (C), hydrogen (H) and boron (B).

7. The reflective mask blank of claim 6 wherein in the high-refractive index layer, a high-refractive index sublayer that is remote from the substrate and in contact with the low-refractive index layer is the first high-refractive index sublayer.

8. A method for manufacturing a reflective mask blank with using the reflective mask blank of claim 1.

\* \* \* \* \*